United States Patent [19]
Moulding et al.

[11] 3,968,460
[45] July 6, 1976

[54] ACOUSTIC SURFACE-WAVE DEVICES

[75] Inventors: Kenneth William Moulding, Horley; David William Parker, Reigate, both of England

[73] Assignee: U.S. Philips Corporation, New York, N.Y.

[22] Filed: July 24, 1974

[21] Appl. No.: 491,559

[30] Foreign Application Priority Data
Aug. 3, 1973 United Kingdom............... 36940/73

[52] U.S. Cl.................................. 333/72; 310/9.8; 333/30 R
[51] Int. Cl.²..................... H03H 9/02; H03H 9/26; H03H 9/32; H01L/41/10
[58] Field of Search............. 333/30 R, 72; 310/9.8, 310/8, 8.1, 8.2, 8.3, 9.7

[56] References Cited
UNITED STATES PATENTS
3,699,364  10/1972  Gerard................................. 310/9.8

*Primary Examiner*—Alfred E. Smith
*Assistant Examiner*—Marvin Nussbaum
*Attorney, Agent, or Firm*—Frank R. Trifari; Bernard Franzblau

[57] ABSTRACT

An acoustic surface wave device having an interdigital array of parallel electrodes includes a set of four parallel active electrodes spaced apart and with a transverse overlap. The second and third electrodes are aligned. The first and third and second and fourth electrodes are respectively connected together and to corresponding other electrodes of the electrode array.

7 Claims, 7 Drawing Figures

ACOUSTIC SURFACE-WAVE DEVICES

This invention relates to acoustic surface-wave devices.

The use of acoustic surface waves has enabled devices, such as frequency-selective filters, to be manufactured which are small, compact and are moreover compatible with integrated circuit manufacturing techniques. Such devices make it possible to avoid difficulties such as the bulk and manufacturing cost associated with the provision of inductors.

An acoustic surface-wave filter is commonly formed from a thin wafer of piezoelectric material on one surface of which a launching and a receiving transducer are arranged respectively to launch and to receive an acoustic surface wave propagating over the surface. Each transducer normally comprises an interdigital array of strip electrodes, the arrays being formed, for example, by a photo-lithographic process from a layer of a suitable metal deposited on the surface of the wafer.

The frequency response of the filter is determined by the number, spacing and dimensional configuration of the electrodes making up each transducer. For convenience of computation, a mathematical model of the array is considered in which each electrode is regarded as representing an individual acoustic surface-wave source and the results obtained from this model are found to be satisfactory in practice for design purposes. By employing techniques of Fourier synthesis and computer optimisation on this mathematical model, a suitable relative distribution of magnitude and spacing of such sources in the launching and receiving transducer arrays can be calculated which can provide a good approximation to a desired bandpass response.

FIG. 1A of the accompanying drawing shows schematically in plan view part of a conventional acoustic surface-wave device which can be used as an intermediate frequency filter for a television receiver. A body A in the form of a wafer of piezoelectric material has applied to its upper surface a launching transducer, part of which is shown, and a receiving transducer (not shown). The transducers comprise arrays of interdigital electrodes formed on the surface of the body A suitably by photo-lithography from a vapour-deposited layer of metal.

The launching transducer shown is a conventional interdigital array of parallel strip electrodes B adapted to direct a beam of acoustic surface waves at the receiving transducer parallel to the line of acoustic surface-wave propagation X. Parallel conductive strips C, D connect together ends of electrodes B of the same polarity and lead to respective input terminals E, F of the launching transducer. The equivalent source strength at the position of each electrode is determined by the total electrical flux arriving at or leaving that electrode and is proportional to the overlap between that electrode and the two adjacent electrodes.

FIG. 1B of the accompanying drawing shows the strength S of the sources at the successive electrode positions $a$, $b$, $c$, $d$, $e$, $f$, $g$ and $h$ along the line of propagation X corresponding to FIG. 1A. The signs (polarity) of the sources alternate with the voltage applied to the electrodes, and FIGS. 1A and 1B illustrate the instant when positive voltage is applied to input terminal E and negative voltage is applied to input terminal F. For example, it can be seen that the electrodes at positions $a$, $b$ and $c$ are positive, negative and positive respectively, and that there is an amount of overlap between the electrodes at $a$ and $b$ of 7 units and an amount of overlap between the electrodes at $b$ and $c$ of 9 units. Thus an electrical flux of 16 units is arriving at the position $b$ and so there is considered to be a source of −16 units at position $b$ at this instant. The 9 units of electrical flux arriving at position $b$ can be regarded also as 9 units of electrical flux leaving position $c$ for the purposes of determining the sign and magnitude of the source at position $c$. In addition there are 9 units of overlap between the electrode at $c$ and the electrode at $d$ which is at a negative voltage at the instant considered. Thus an electrical flux of 18 units is leaving position $c$ and so there is considered to be a source of +18 units at position $c$ at this instant. FIG. 1A shows the direction of the electrical field and the relative magnitudes of electrical flux due to the overlap between adjacent fingers for all the other electrodes shown, and FIG. 1B shows the resulting magnitude and sign of the resulting sources at the positions $d$, $e$, $f$, $g$ and $h$ of those electrodes.

It will be seen from the above description with reference to FIGS. 1A and 1B that the conventional interdigital electrode array imposes certain restrictions on how a distribution of source strengths may be reproduced. That is to say that the direction of the electric field necessarily alternates from one gap to the next, which means that the sources must be of alternating sign and each have a magnitude equal to the sum of the electrical flux due to the overlap between the electrode at that position and the two adjacent electrodes. This may make it impossible to produce a distribution of source strengths which has been calculated as necessary to give a desired characteristic to the transducer.

An object of the present invention is to reduce or overcome these restrictions.

According to the present invention there is provided an acoustic surface-wave device including a body of piezoelectric material on one surface of which is formed a launching or receiving transducer including an interdigital array of electrodes modified so as to include at least one set of four electrodes, in which set the first and second electrodes are spaced apart in the line of acoustic surface-wave propagation through the transducer and overlap, the third electrode is aligned with the second electrode and electrically connected in common with the first electrode, and the fourth electrode is spaced apart from the second and third electrodes in said line of propagation, overlaps the third electrode and is electrically connected in common with the second electrode, the arrangement being such that in operation the electrical field between the overlapping third and fourth electrodes has the same direction as the electrical field between the overlapping first and second electrodes.

BRIEF DESCRIPTION OF THE DRAWINGS

Embodiments of the invention will now be described, by way of example, with reference to FIGS. 2A, 2B, 3, 4 and 5 of the accompanying drawings, in which:

Referring now to FIGS. 2A and 2B, the letters A, B, C, D, E and F refer to the body of piezoelectric material, parallel strip electrodes, parallel conductive strips and input terminals in the same manner as has been used above in the description of the conventional device with reference to FIGS. 1A and 1B. It will be seen that the sources at positions $a$, $b$, $c$, $f$, $g$ and $h$ are produced in the conventional manner. However, the sources at positions $d$ and $e$ are not produced in the conventional manner and the configuration of the set of four electrodes B1, B2, B3 and B4 will now be described in detail. Electrodes B1 and B2 are connected to terminals E and F respectively which will be considered as having positive and negative voltages respectively applied thereto at a given instant. There are 4 units of overlap between electrodes B1 and B2 which results in 4 units of electrical flux leaving the source at position $c$ and correspondingly 4 units of electrical flux arriving at the source at position $d$. Electrode B3 is aligned with electrode B2 and connected electrically in common with electrode B1. Electrode B4 is located at position $e$, overlaps electrode B3 by 1 unit and is connected electrically in common with electrode B2. Thus the electrical field between the overlapping electrodes B3 and B4 is in the same direction as the electrical field between the overlapping electrodes B1 and B2. Thus the strength of the source at position $d$ is due to the difference between the electrical flux in the gap between positions $c$ and $d$ and the electrical flux in the gap between positions $d$ and $e$. Furthermore, by connecting the electrode at position $f$ to the positive terminal E, the source at position $e$ is made negative, i.e. having the same sign as the source at position $d$.

Figure 1A:
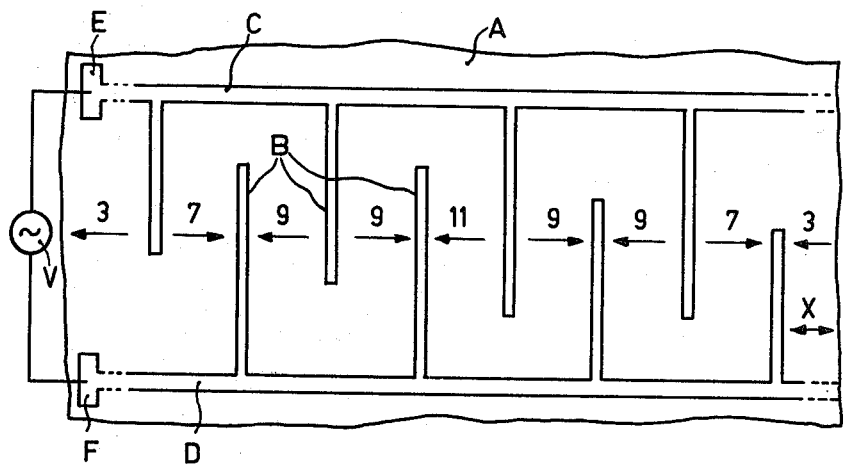
FIG. 1A shows a schematic plan view of part of a conventional acoustic surface-wave device.
Figure 1B:
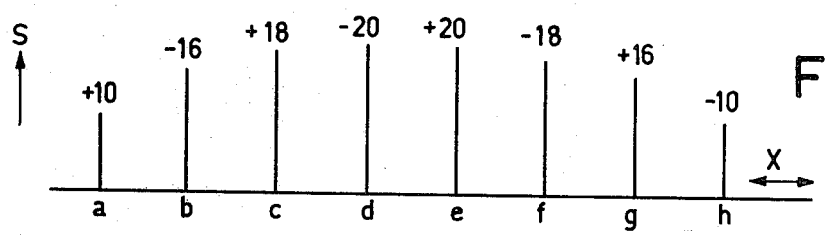
FIG. 1B shows the strength of the sources at successive electrode positions of the device of FIG. 1A.
Figure 2A:
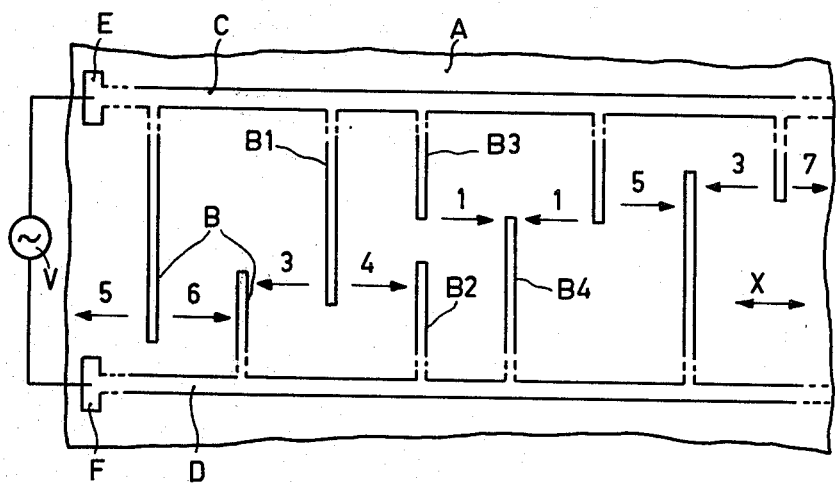
FIG. 2A shows schematically in plan view part of a first acoustic surface-wave device according to the invention.
Figure 2B:
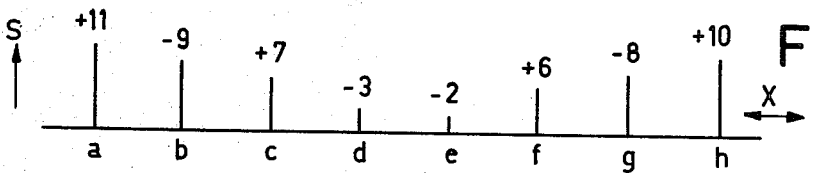
FIG. 2B shows the strength of the sources at the successive electrode positions along the line of acoustic surface-wave propagation corresponding to FIG. 2A, and FIGS. 3, 4 and 5 show second, third and fourth acoustic surface-wave devices, respectively, according to the invention.
Figure 3:
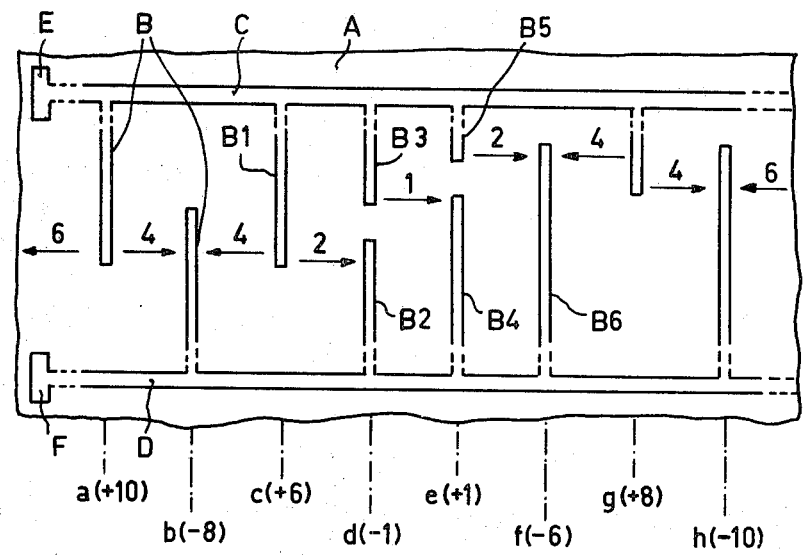
Referring now to FIG. 3, the reference letters A, B, C, D, E and F are used with the same meaning as in FIG. 2A. The set of four electrodes B1, B2, B3 and B4 are arranged so that the electrical field between the overlapping electrodes B3 and B4 is in the same direction as the electrical field between the overlapping electrodes B1 and B2. Thus the strength of the source at position $d$ is due to the difference between the electrical flux in the gap between positions $c$ and $d$ and electrical flux in the gap between positions $d$ and $e$. Furthermore electrode B5 is aligned with electrode B4 and connected electrically in common with electrode B3, and electrode B6 is located at position $f$, overlaps electrode B5 and is connected electrically in common with electrode B4. Thus electrodes B3, B4, B5 and B6 form a set of four such that the electrical field between the overlapping electrodes B5 and B6 is in the same direction as the electrical field between the overlapping electrodes B3 and B4. Thus the source at position $e$ is positive, and so the sign of the sources at positions $d$, $e$ and $f$ alternate as is the case in a conventional interdigital array. However, the effect of the set of four electrodes B1, B2, B3 and B4 and the set of four electrodes B3, B4, B5 and B6 has been to produce a distribution of magnitudes of sources which could not be achieved with a conventional interdigital array.
Figure 4:
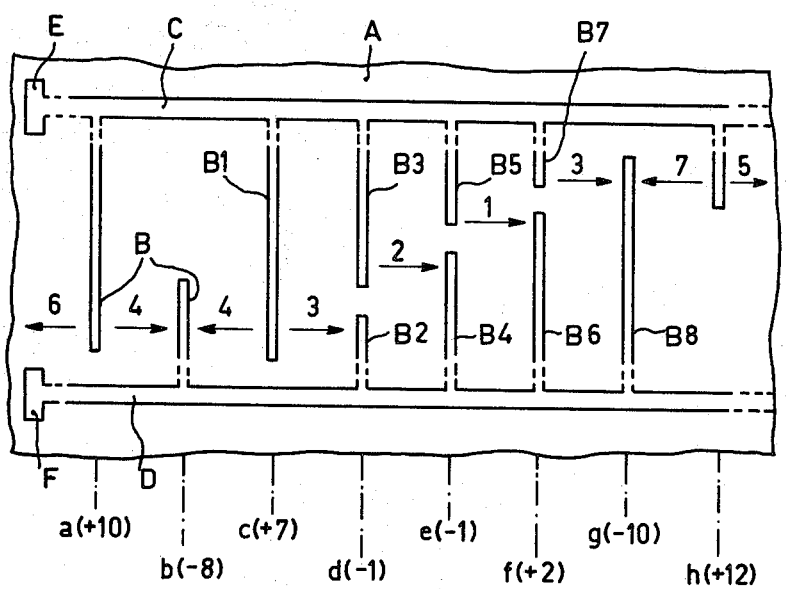
Referring now to FIG. 4, the reference letters A, B, C, D, E and F are again used with the same meaning as in FIG. 2A. Here there are three successive sets of four electrodes, i.e. the first set B1, B2, B3 and B4, the second set B3, B4, B5 and B6, and the third set B5, B6, B7 and B8. Thus the electric field is in the same direction in four successive gaps, i.e. between positions $c$ and $d$, positions $d$ and $e$, positions $e$ and $f$, and positions $f$ and $g$. The effect is to produce two successive sources of the same sign, i.e. at positions $d$ and $e$, as is done in the embodiment described with reference to FIGS. 2A and 2B. However, in the case of FIG. 4 the magnitude of the source at position $e$ is less than that due to the electrical flux arriving at electrode B4 resulting from its overlap with electrode B3.
Figure 5:
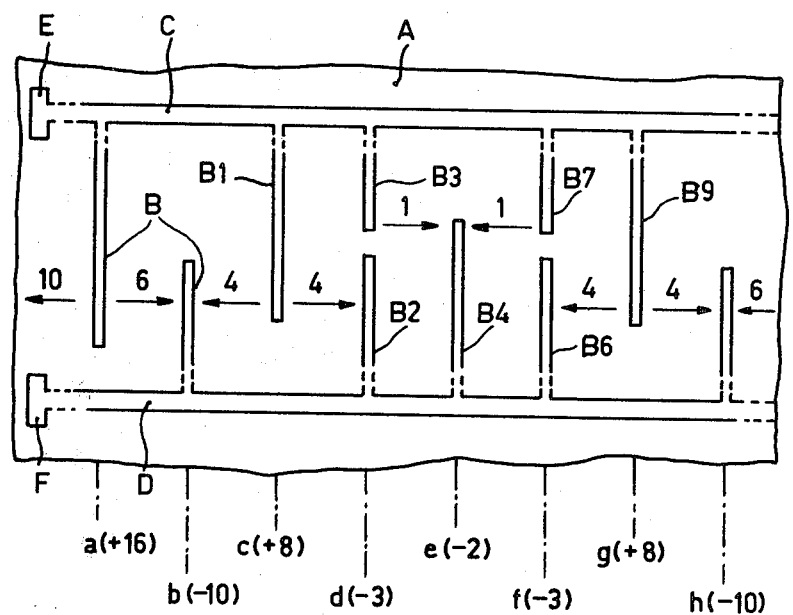
Referring now to FIG. 5, the reference letters A, B, C, D, E and F are again used with the same meaning as in FIG. 2A. Here there are two sets of four electrodes, i.e. the first set B1, B2, B3 and B4, and the second set B4, B7, B6 and B9. Thus the electrical field is in the same direction in the two gaps on either side of the electrodes B2 and B3, and is also in the same direction in the two gaps on either side of the electrodes B6 and B7. The effect is to produce three successive sources of the same sign, i.e. at positions $d$, $e$ and $f$.

What is claimed is:

1. An acoustic surface-wave device comprising a body of piezoelectric material on one surface of which is formed a launching or receiving transducer including an interdigital array of electrodes which includes at least one set of four spaced electrodes, in which set the first and second electrodes are spaced apart along the line of acoustic surface-wave propagation through the transducer and overlap transverse to said propagation line, the third electrode is aligned with the second electrode and is electrically connected in common with the first electrode, and the fourth electrode is spaced apart from the second and third electrodes in said line of propagation, overlaps the third electrode transverse to said propagation line and is electrically connected in common with the second electrode, and means for applying an electric potential to said array of electrodes such that in operation the electrical field between the overlapping third and fourth electrodes has the same direction as the electrical field between the overlapping first and second electrodes.

2. An acoustic surface-wave device as claimed in claim 1, in which the electrodes of the transducer are arranged so that in operation the position along the line of acoustic surface-wave propagation through the transducer where said first electrode is located has a net electric field leaving it (or arriving at it), the position where said second and third electrodes are located has a net electric field arriving at it (or leaving it respectively), and the position where said fourth electrode is located has a net electric field arriving at it (or leaving it respectively).

3. An acoustic surface wave device comprising a substrate composed of piezoelectric material adapted to propagate acoustic surface wave energy, an electromechanical transducer supported on one surface of the substrate and including an array of parallel spaced apart conductive electrodes alternate ones of which are electrically connected to form an interdigitated electrode array with a transverse overlap between at least some of the adjacent electrodes along the longitudinal direction of the array, said array of electrodes including a set of four consecutive parallel electrodes in which the first and second electrodes are spaced apart in the longitudinal direction with a transverse overlap, the third electrode is colinear with the second electrode and is electrically connected to the first electrode and the fourth electrode is electrically connected to the second electrode and is spaced apart from the second and third electrodes in the longitudinal direction and overlaps the third electrode in the transverse direction, and means for applying an electric potential to said array of electrodes.

4. An acoustic surface wave device as claimed in claim 3 wherein at least some of the electrodes of the electrode array are disposed so that the amount of transverse overlap between adjacent electrodes varies along the longitudinal direction of the array.

5. An acoustic surface wave device as claimed in claim 4 further comprising a second set of four consecutive parallel electrodes in which the third and fourth electrodes of the first set of electrodes constitute the first and second electrodes of the second set of electrodes, the third electrode of the second set is colinear with the second electrode of the second set and is electrically connected to the first electrode of the second set, and the fourth electrode of the second set is electrically connected to the second electrode of the second set is spaced apart from said second set second and third electrodes in the longitudinal direction and overlaps the second set third electrode in the transverse direction.

6. An acoustic surface wave device as claimed in claim 3 further comprising a second set of four consecutive parallel electrodes in which the third and fourth electrodes of the first set of electrodes constitute the first and second electrodes of the second set of electrodes, the third electrode of the second set is colinear with the second electrode of the second set and is electrically connected to the first electrode of the second set, and the fourth electrode of the second set is electrically connected to the second electrode of the second set and is spaced apart from said second set second and third electrodes in the longitudinal directions and overlaps the second set third electrode in the transverse direction.

7. An acoustic surface wave device as claimed in claim 3 further comprising a second set of four consecutive parallel electrodes in which the fourth electrode of the first set constitutes the first electrode of the second set of electrodes, the third electrode of the second set is colinear with the second electrode of the second set and is electrically connected to the first electrode of the second set, and the fourth electrode of the second set is electrically connected to the second electrode of the second set and is spaced apart from said second set second and third electrodes in the longitudinal direction and overlaps the second set third electrode in the transverse direction.

* * * * *

UNITED STATES PATENT AND TRADEMARK OFFICE
CERTIFICATE OF CORRECTION

PATENT NO. : 3,968,460
DATED : July 6, 1976
INVENTOR(S) : KENNETH WILLIAM MOULDING ET AL It is certified that error appears in the above-identified patent and that said Letters Patent are hereby corrected as shown below:

Claim 2, line 3, after "operation" insert -- , when --;

line 6, cancel "(or arriving at it)," and insert -- , then --;

line 7, before "electrodes" insert -- aligned --;

lines 8-9, cancel "(or leaving it respectively)";

lines 10-11, cancel "(or leaving it respectively)";

Signed and Sealed this

Twenty-third Day of November 1976

[SEAL]

Attest:

RUTH C. MASON
Attesting Officer

C. MARSHALL DANN
Commissioner of Patents and Trademarks